United States Patent [19]

Ahn

[11] Patent Number: 5,467,882
[45] Date of Patent: Nov. 21, 1995

[54] SIGNAL LINE STRUCTURE FOR A TFT-LCD AND METHOD FOR FABRICATING THE SAME

[75] Inventor: Byung C. Ahn, Kyungki-do, Rep. of Korea

[73] Assignee: Goldstar Co., Ltd., Seoul, Rep. of Korea

[21] Appl. No.: 145,772

[22] Filed: Oct. 29, 1993

[30] Foreign Application Priority Data

Nov. 7, 1992 [KR] Rep. of Korea .................. 20859/1992

[51] Int. Cl.$^6$ .................................................. C30B 33/00
[52] U.S. Cl. .............................. 216/23; 216/41; 216/75; 216/100
[58] Field of Search ................................ 156/650, 656, 156/657, 662, 901; 437/40, 41, 53, 181, 187, 228, 245; 216/23, 41, 75, 100

[56] References Cited

U.S. PATENT DOCUMENTS 5,091,337  2/1992  Watanabe ................................ 437/181

Primary Examiner—William Powell
Attorney, Agent, or Firm—John P. White

[57] ABSTRACT

A signal line structure for TFT-LCD and a method for fabricating the same are disclosed. The method comprises the steps of: forming a first metal and a second metal, in due order, on a glass substrate; defining the width ($W_1$) of the second metal and subsequently, applying an etching process to the second metal; and depositing a third metal entirely on the resulting structure and defining the width ($W_2$) of signal line so as to simultaneously remove the unnecessary portions of the first metal and said third metal. The signal line structure fabricated by the method is structured to comprise an insulating substrate; a first metal formed on the insulating substrate, having a good adhesiveness to said insulating substrate; a second metal formed on the first metal, having a low resistance; a third metal comprised of the same material that the first metal is, the third metal together with the first metal surrounding the second metal to prevent the oxidation of said second metal. A disconnection in the signal line is prevented by twice etching processes. The leakage and the shortage between the source/drain electrode and the gate electrode are prevented in the TFT-LCD structure. The method provides a pad to which COG can be applied, and brings about such an effect that the production yield is improved.

6 Claims, 5 Drawing Sheets

SIGNAL LINE STRUCTURE FOR A TFT-LCD AND METHOD FOR FABRICATING THE SAME

BACKGROUND OF THE INVENTION

The present invention relates in general to a thin film transistor-liquid crystal display (hereinafter "TFT-LCD"), and more particularly to a signal line structure for TFT-LCD and a method for fabricating the same, capable of reducing the resistance of the signal line and improving the production yield.

Hereinafter, a conventional TFT-LCD and a fabrication method will be described along with the problems generated thereby with reference to several drawings.

Referring initially to FIG. 1, there is shown a signal line structure for TFT-LCD which was reported in "Japan display (89), Kyoto" pp. 498 to Ikeda.

As shown in FIG. 1, the TFT-LCD structure is formed of a glass substrate 1 which comprises a first metal (tantalum film) 2, a second metal (copper film) 3 and a third metal (tantalum film) 4 which are piled to form signal lines, that is, a gate electrode 13a and a data line 13b, along with an insulating film 5 covering the signal lines, an amorphous silicon layer 6, an n$^+$ amorphous silicon layer 7 and a source/drain electrode 8 that are formed over the gate electrode 13a, in due order.

In the meanwhile, the field of the invention is the signal lines. Of the components consisting of the signal lines, the first metal film 2 plays a role in improving the adhesiveness to the glass substrate 1. The second metal film 3, another component, allows the resistance to be reduced to, for example, about 3 $\mu\Omega$·cm, whereas the third metal film 4, another component, is formed in order to prevent the oxidation of the second metal film which is vulnerable to oxidation.

Referring now to FIG. 2, there is illustrated a conventional method for fabricating the signal line for TFT-LCD. First, over a glass substrate 1, a first metal (tantalum) film 2 with a thickness of approximately 500 Å is deposited by sputtering, followed by the deposition of a second metal (copper) film 3 and a third metal (tantalum) film 4 which are approximately 2,000 and 500 Å thick, respectively, over the first metal film 2 in due order, as shown in FIG. 2A.

Subsequently, on the third metal film 4 is deposited a photoresist 9 which is, then, subjected to photo lithography to define the width of signal line, and the third metal film 4 is subjected to the treatment of dry etching under $CF_4/O_2$ gas to expose the second metal film 3, as shown in FIG. 2B.

Next, the exposed second metal 3 is subjected to a wet etching process in an acetic acid type solution and the first metal 2 is treated in a manner similar to that of the third metal 4 under $CF_4/O_2$ gas, as shown in FIG. 2C.

Finally, the photoresist 9 is removed and an insulating film 5 is formed in a thickness of approximately 5,500 Å by a plasma chemical vapor deposition process, so as to fabricate a signal line for TFT-LCD, as shown in FIG. 2D.

However, there occurs several problems in performing the above conventional method. Particularly, when the wet etching is applied to the second metal 3, subsequent to the dry etching for the third metal 4 as shown in FIG. 2C, the side surface of the second metal 3 is etched as shown in FIG. 3A, which is a partially enlarged detailed view, since the wet etching, in principle, has the same etching speed for a vertical and a horizontal direction. In addition, since the signal line insulating film 5 is formed of a silicon oxide film under an oxidative atmosphere, the second metal 3 is oxidized, so that the volume of the second metal is expanded, which results in bending of the third metal 4, as shown in FIG. 3B, which is another enlarged, detailed view of the A part of FIG. 2C.

The deformed structure causes to generate a leakage between the gate electrode and the source/drain electrode in a thin film transistor fabricated. In the worst case, there occurs a shortage phenomenon between the gate electrode and the source/drain electrode, so that the quality of the TFT-LCD becomes defective.

For preventing the shortage between the gate electrode and the source/drain electrode, the gate electrode is subjected to the treatment of anode oxidation to form an anode oxide film, or an insulating film, which is structured to comprise double components of a silicon oxide film and a silicon nitride film. However, application of anode oxidation to the signal line which is structured to comprise treble components of the first metal 2, the second metal 3 and the third metal 4 as shown in the conventional structure is accompanied by the anode oxidation of the upper third metal 4. At this time, the side portion of the second metal 3 is not oxidized. In addition, it is placed under such a danger that it may be corroded by a solution for anode oxidation. Consequently, even this method is not enough to prevent the leak current between gate electrode and the source/drain electrode from being generated in a TFT-LCD and to improve the production yield.

SUMMARY OF THE INVENTION

For solving the aforementioned problems, the present inventors have recognized that there exists a need for a novel signal line structure for TFT-LCD, wherein leakage and shortage between the gate electrode and the source/drain electrode transistor do not occur, along with a method for fabricating the same.

Accordingly, in an aspect of the present invention, there is provide a signal line structure for TFT-LCD, having a remarkably reduced resistance.

According to another aspect of the present invention, there is provided a signal line structure for TFT-LCD, preventive of a signal delay phenomenon.

According to a further aspect of the present invention, there is a method for fabricating a signal line structure for TFT-LCD, capable of improving the production yield.

In accordance with the present invention, the above objects are accomplished by providing a method for fabricating a signal line structure for TFT-LCD, which comprises the steps of: forming a first metal and a second metal, in due order, on a glass substrate; defining the width ($W_1$) of the second metal and subsequently, applying an etching process to the second metal; and depositing a third metal entirely on the resulting structure and defining the width ($W_2$) of signal line so as to simultaneously remove the unnecessary portions of the first metal and said third metal.

Accordingly, the signal line fabricated by the inventive method is structured to comprise an insulating substrate; a first metal formed on the insulating substrate, said first metal having a good adhesiveness to said insulating substrate; a second metal formed on said first metal, said second metal having a low resistance; a third metal comprised of the same material that said first metal is, said third metal together with said first metal surrounding said second metal to prevent the oxidation of said second metal.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
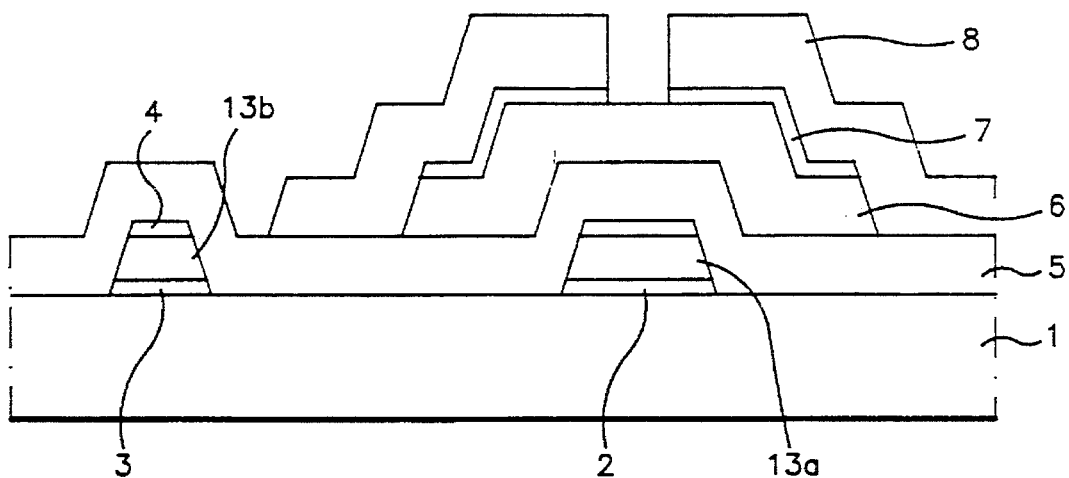
FIG. 1 is a schematic, cross-sectional view showing the structure of a conventional TFT-LCD.
Figure 2A:
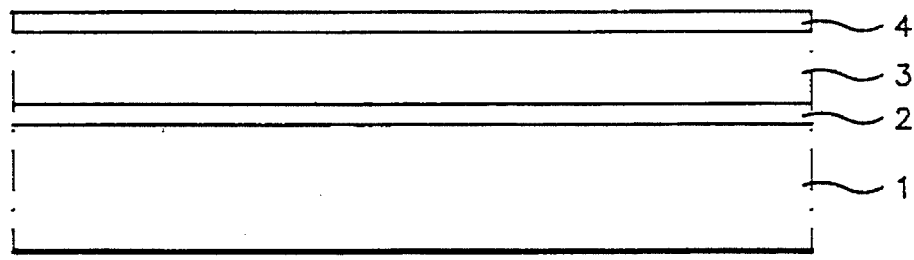
FIGS. 2A to 2D are schematic, cross-sectional views illustrating the steps of fabricating a signal line for conventional TFT-LCD, respectively.
Figure 2B:
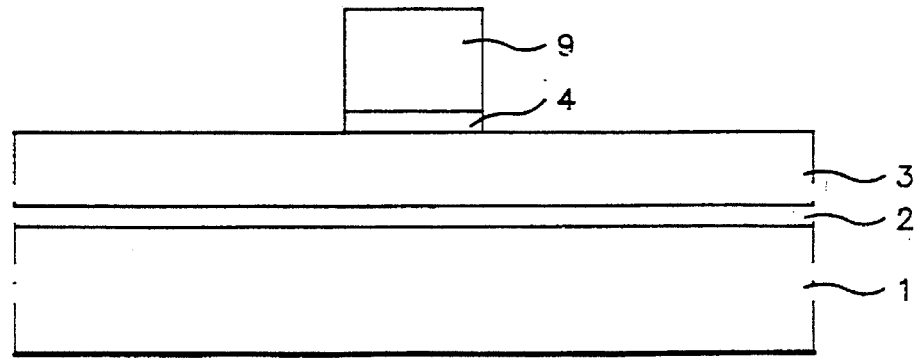
Figure 2C:
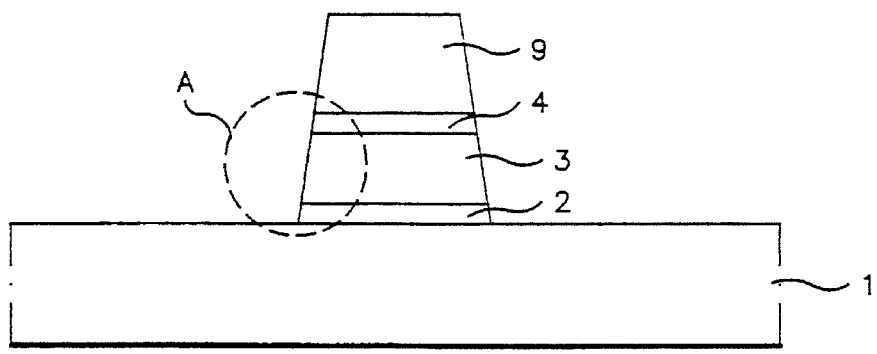
Figure 2D:
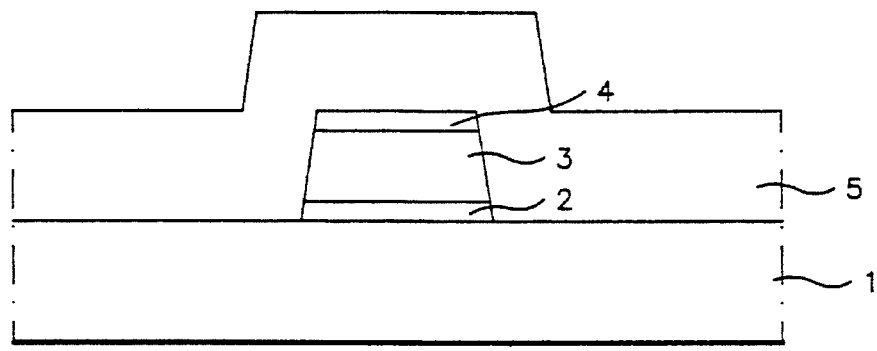
Figure 3A:
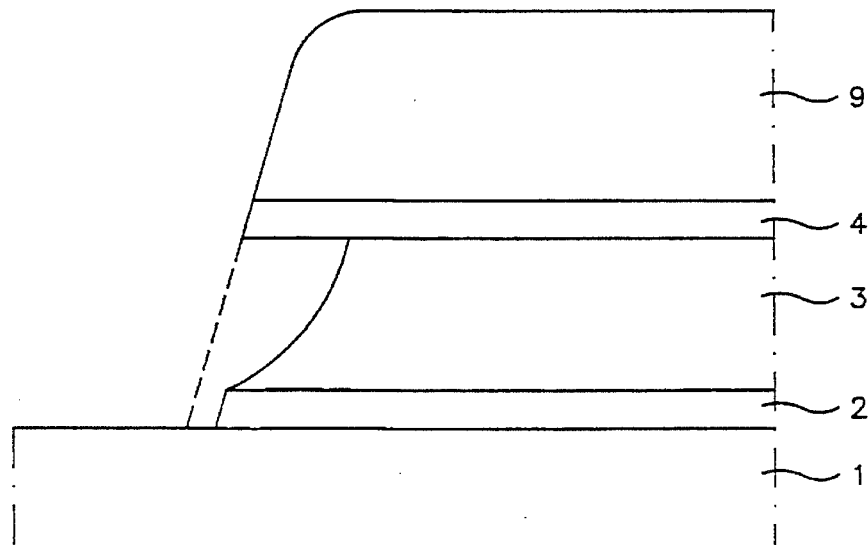
FIGS. 3A and 3B are schematic, enlarged detailed cross-sectional views for the A part of FIG. 2C, illustrating the problems generated by the conventional method, respectively.
Figure 3B:
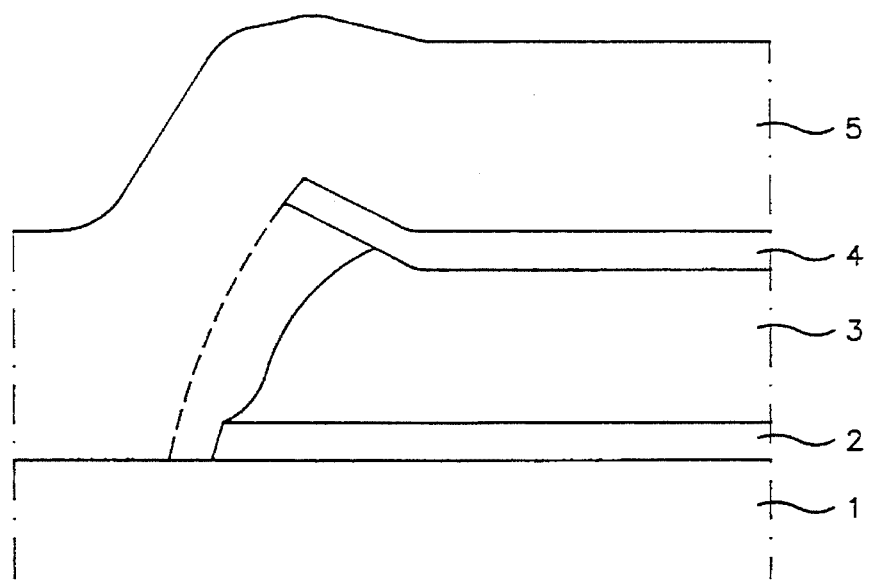
Figure 4:
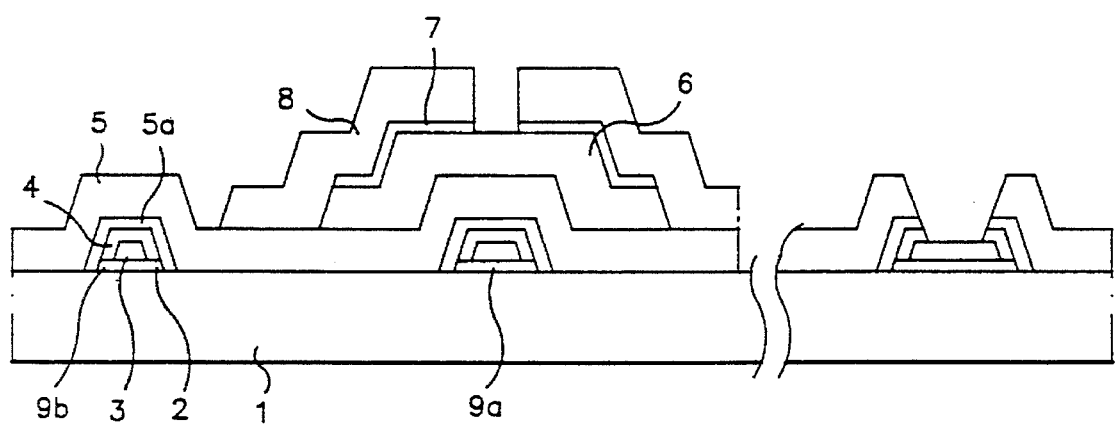
FIG. 4 is a schematic, cross-sectional view showing the structure of TFT-LCD according to the present invention.

Hereinafter, preferred embodiments of the present invention will be described in detail with reference to the drawings, wherein like reference numerals designate like parts. FIG. 4 is a schematic sectional view showing the structure of TFT-LCD according to the present invention. As shown in FIG. 4, this TFT-LCD is formed of a glass substrate 1 which comprises a first metal 2 that has a good adhesiveness, like tantalum and niobium, a second metal 3 that is excellent in conductivity, like copper, and a third metal 4, the first metal 2 and the third metal 4 enclosing the second metal 3 to form a signal line, that is, a gate electrode 9a and a data line 9b, along with a first insulating film 5a of $Ta_2O_5$ or $Nb_2O_2$ formed on the surface of the signal line by the application of anode oxidation to the first metal 2 and the second metal 3, a second insulating film 5 formed entirely in a conventional structure, an amorphous silicon 6, an $n^+$ amorphous silicon 7, and a source and drain electrode 8.

The first metal and the third metal may be selected from the group consisting of titanium (Ti), vanadium (V) and group III Metals in place of tantalum (Ta) and niobium (Nb). Aluminum or aluminum alloy may be used for the second metal instead of copper.

Description for the method for fabricating a TFT-LCD signal line will be given next with reference to FIGS. 5 to 7.

Referring initially to FIG. 5, there are cross-sectional views illustrating the steps for fabricating a signal line for TFT-LCD, respectively, according to a first preferred embodiment of the present invention.

Figure 5A:
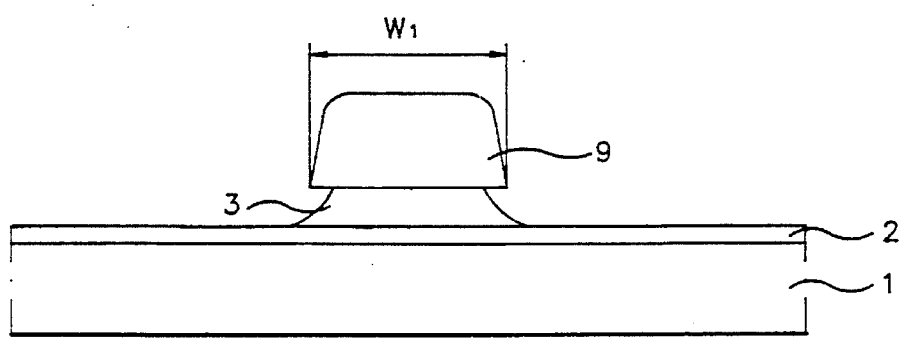
FIGS. 5A to 5D are schematic, cross-sectional views illustrating the steps of fabricating a signal line for TFT-LCD according to a first embodiment of the present invention, respectively.

Firstly, over a glass substrate 1, a first metal 2 such as tantalum or niobium which is approximately 200 to 1,000 Å thick and a second metal 3 such as copper having a low resistance which is approximately 500 to 1,000 Å thick are deposited by sputtering, in due order, following the coating of a photoresist over the second metal 3. A photo lithography process is applied to the photoresist 9 so as to define the predetermined width ($W_1$) of the photoresist 9. Following this, the second metal 3 is subjected to a wet etching process in an acetic solution ($CH_3COOH$). The wet etching process makes the second metal 3 etched in both vertical and horizontal directions, so that the second metal 3 may be structured to have the same pattern as shown in FIG. 5A.

Figure 5B:
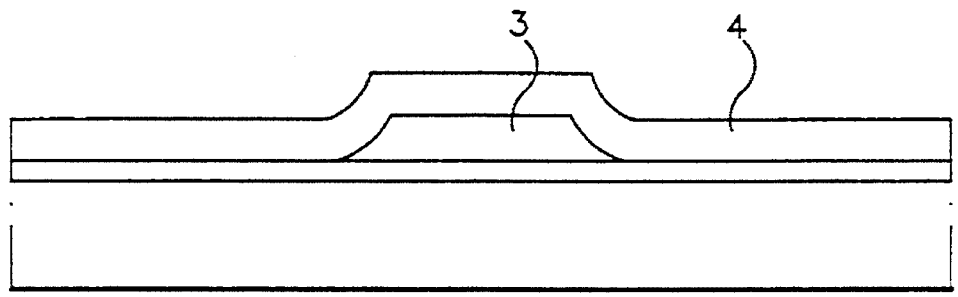

Nextly, the photoresist 9 is removed and a third metal 4 is then, deposited entirely on the resulting structure in a thickness of approximately 500 to 1,500 Å, as shown in FIG. 5B.

Figure 5C:
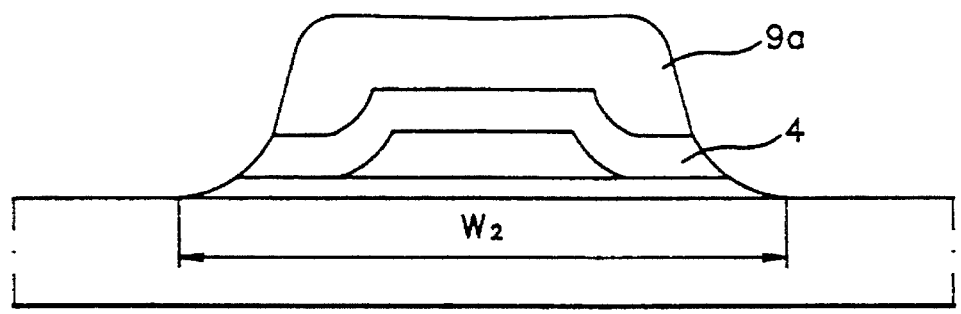

Subsequently, a photoresist 9a is deposited over the third metal 4 and then patterned by a photo lithography process, so as to define a predetermined width ($W_2$) thereof which is wider by at least 1 μm than the width ($W_1$) of the second metal 3, as shown in FIG. 5C. Following this, an etching process is undertaken to remove the unnecessary portions of the first and the third metals 2 and 4, as shown in FIG. 5C. In case that the first metal 2 and the third metal 4 are formed of tantalum, the etching process is carried out under $CF_4/O_2$ gas.

Figure 5D:
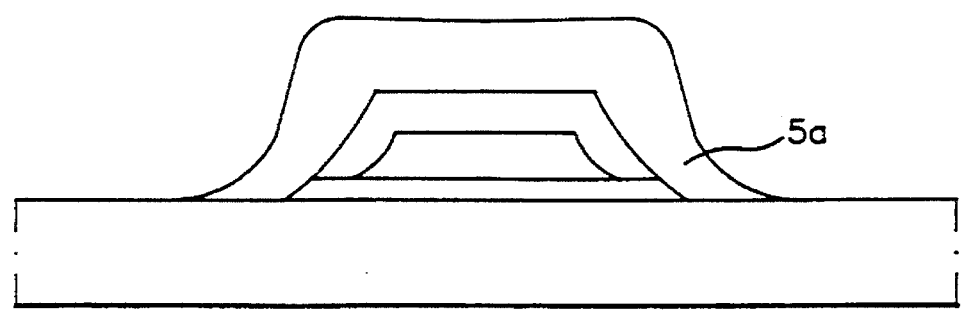

Lastly, the photoresist 9a is removed, and an anode oxidation process is applied to the first metal 2 and third metal 4 in an ammonium stannate aqueous solution having a concentration of approximately 0.1 to 0.001 mol/l at a voltage of approximately 50 to 100 V, so as to form a first insulating film 5a on the exposed surface of the first metal 2 and third metal 4 in a thickness of 800 to 1,600 Å, as shown in FIG. 5D. Under the condition, the first insulating film 5a becomes made of $Ta_2O_5$ or $Nb_2O_5$.

Figure 6A:
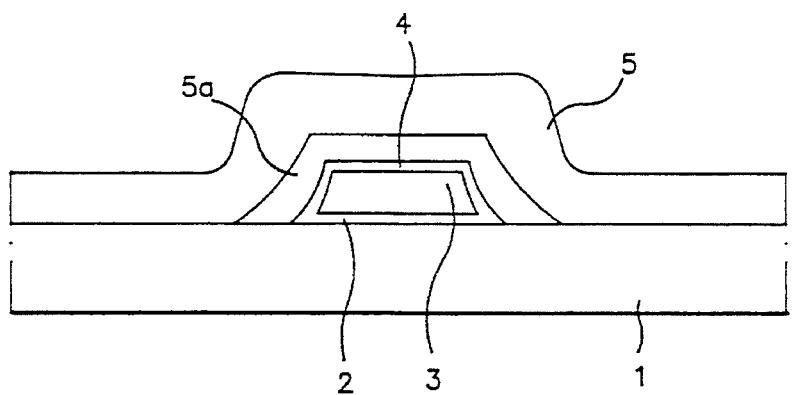
FIGS. 6A and 6B are schematic, cross-sectional views illustrating the steps of fabricating a pad part for TFT-LCD according to a second embodiment of the present invention, respectively.
Figure 6B:
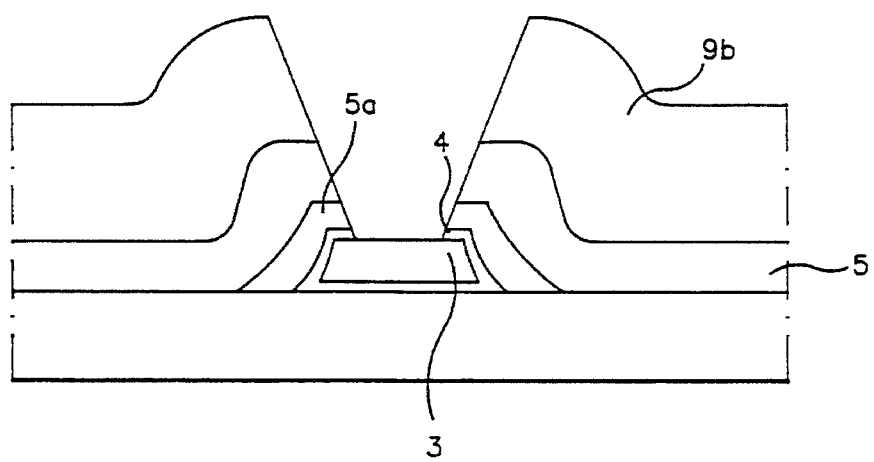

Following the performance of the steps for fabricating a TFT-LCD signal line, a pad region is formed as shown in FIG. 6. For this, a silicon nitride film or silicon oxide film is initially deposited over the resulting structure in a thickness of approximately 3,000 Å, so as to form a second insulating film 5, as shown in FIG. 6A. Subsequently, a photoresist 9b is deposited over the second insulating film 5, and a photo lithography process is then applied to the upper portion of the pad, so that the portion is so patterned as to be open. For the purpose of forming a pad region, a dry or wet etching process is undertaken to etch the first film 5a, the second insulating film 5, and the third metal 4, in due order.

Figure 7:
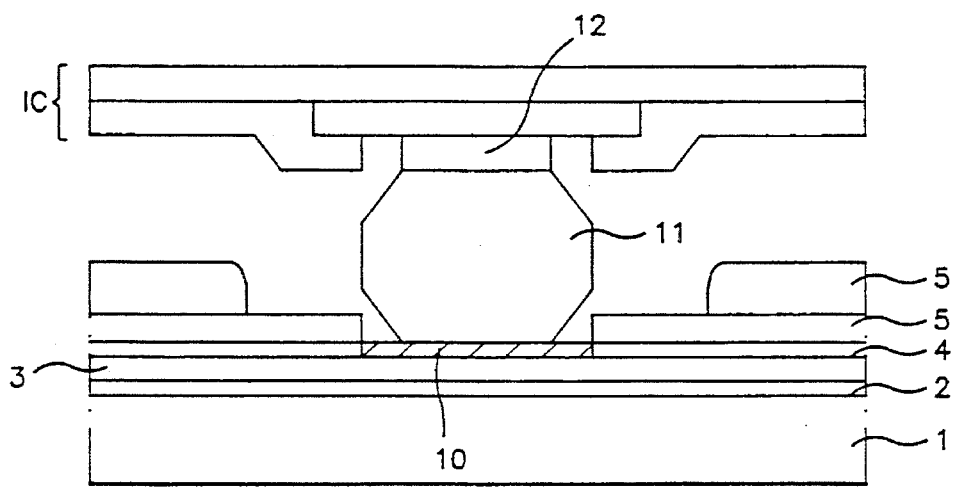
FIG. 7 is a schematic, cross-sectional view illustrating the case that an IC chip is connected with the pad according to the present invention.

Turning now to FIG. 7, there is illustrated a process for connecting an IC chip with the pad according to the present invention. For the connection, gold (Au) 10 is electrically deposited by use of electroplating process on or above the second metal 3 of the pad structure according to the present invention, and using a connecting material 11 of Pb/Sm type alloy, copper 12 of an IC chip positioned the over the connecting portion of the wiring is connected with the second metal 3.

Therefore, it is unnecessary to form a metal again for the application of chip-on-glass (COG). As a result, the process is simplified by use of the metal of wiring in the pad.

As described above, a disconnection in the signal line is prevented by twice etching processes in accordance with the present invention. In addition, the leakage and the shortage between the source/drain electrode and the gate electrode are prevented in the inventive TFT-LCD structure. Furthermore, the method for fabricating a TFT-LCD signal line provides a pad to which COG is capable of being applied, and brings about such an effect that the production yield is improved.

What is claimed is:

1. A method for fabricating a signal line for TFT-LCD, comprising the steps of:

forming a first metal and a second metal, in this order, on a glass substrate;

defining the width ($W_1$) of said second metal and subsequently, applying an etching process to said second metal;

depositing a third metal entirely on the resulting structure and defining the width ($W_2$) of the signal line so as to simultaneously remove the unnecessary portions of said first metal and said third metal.

2. A method according to claim 1, which further comprises the step of applying an anode oxidation process to the surfaces of said first metal and said third metal so as to form a first insulating film.

3. A method according to claim 1, in which said first metal and said third metal are selected from the group consisting of tantalum, niobium, vanadium, and group III metals.

4. A method according to claim 1, in which said second metal is selected from the group consisting of copper, copper alloy, aluminum, and aluminum alloy.

5. A method according to claim 1, in which said width ($W_2$) of signal line is at least 1 ∞m wider than said width ($W_1$) of said second metal.

6. A method according to claim 1, in which said etching process for said second metal is a wet etching process that is carried out in an acetic acid type solution.

* * * * *